(12) United States Patent
Kim

(10) Patent No.: US 9,502,472 B2
(45) Date of Patent: Nov. 22, 2016

(54) IMAGE SENSOR AND METHOD OF MANUFACTURING THE SAME

(71) Applicant: Samsung Electronics Co., Ltd., Suwon-Si, Gyeonggi-Do (KR)

(72) Inventor: Kyu-Sik Kim, Jeonju-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 104 days.

(21) Appl. No.: 14/201,198

(22) Filed: Mar. 7, 2014

(65) Prior Publication Data

US 2014/0183514 A1 Jul. 3, 2014

Related U.S. Application Data

(62) Division of application No. 13/234,702, filed on Sep. 16, 2011, now Pat. No. 8,691,615.

(30) Foreign Application Priority Data

Jan. 11, 2011 (KR) ........................ 10-2011-0002869

(51) Int. Cl.
*H01L 31/102* (2006.01)
*H01L 27/30* (2006.01)
*B82Y 10/00* (2011.01)
*H01L 51/00* (2006.01)
*H01L 51/42* (2006.01)

(52) U.S. Cl.
CPC ............. *H01L 27/307* (2013.01); *B82Y 10/00* (2013.01); *H01L 51/0037* (2013.01); *H01L 51/0046* (2013.01); *H01L 51/0053* (2013.01); *H01L 51/0078* (2013.01); *H01L 51/0081* (2013.01); *H01L 51/424* (2013.01); *H01L 51/4253* (2013.01); *H01L 51/4293* (2013.01)

(58) Field of Classification Search
CPC ........... H01L 27/3269; H01L 27/3227; H01L 31/02024; H01L 25/167; H01L 27/1464–27/14681
See application file for complete search history.

(56) References Cited

U.S. PATENT DOCUMENTS

| 4,404,586 A | 9/1983 | Tabei |
| 2002/0003201 A1 | 1/2002 | Yu |
| 2005/0205903 A1 | 9/2005 | Hioki |
| 2009/0057725 A1* | 3/2009 | Kim ................. H01L 27/14636 257/252 |

(Continued)

FOREIGN PATENT DOCUMENTS

| CN | 1088690 A | 6/1994 |
| JP | 05127015 A | 5/1993 |

(Continued)

OTHER PUBLICATIONS

Hokuto Seo et al., "Stacked color image sensor using wavelength-selective organic photoconductive films with zinc—oxide thin film transistors as signal readout circuit," Sensors, Cameras, and Systems for Industrial/Scientific Applications XI, edited by Erik Bodegom, Valerie Nguyen, Proc. of SPIE-IS&T Electronic Imaging, SPIE vol. 7536, 753602, 2010, pp. 753602-1-753602-8.

*Primary Examiner* — Cuong B Nguyen
(74) *Attorney, Agent, or Firm* — Harness, Dickey & Pierce, P.L.C.

(57) ABSTRACT

An image sensor and a method of manufacturing the same. The image sensor includes a plurality of photoelectric conversion units that are horizontally arranged and selectively emit electric signals by absorbing color beams.

12 Claims, 5 Drawing Sheets

(56) References Cited

U.S. PATENT DOCUMENTS

| | | |
|---|---|---|
| 2009/0229668 A1 | 9/2009 | Kim et al. |
| 2009/0294761 A1 | 12/2009 | Kim et al. |
| 2009/0308458 A1 | 12/2009 | Aramaki et al. |
| 2009/0322923 A1* | 12/2009 | Maehara ................. 348/308 |
| 2011/0049588 A1 | 3/2011 | Isobe et al. |

FOREIGN PATENT DOCUMENTS

| | | |
|---|---|---|
| JP | 10173867 A | 6/1998 |
| KR | 20050062001 A | 6/2005 |

\* cited by examiner

IMAGE SENSOR AND METHOD OF MANUFACTURING THE SAME

CROSS-REFERENCE TO RELATED APPLICATIONS

This application is a divisional of and claims priority under 35 U.S.C. §§120/121 to U.S. patent application Ser. No. 13/234,702, filed on Sep. 16, 2011, which claims priority under 35 U.S.C. §119 to Korean Patent Application No. 10-2011-0002869, filed on Jan. 11, 2011, in the Korean Intellectual Property Office (KIPO), the entire contents of each of which are incorporated herein by reference in their entirety.

BACKGROUND

1. Field

The present disclosure relates to image sensors and methods of manufacturing the same.

2. Description of the Related Art

Image sensors, which are semiconductor devices for converting an optical image into an electric signal, may be classified into charge-coupled device (CCD) image sensors and complementary metal oxide silicon (CMOS) image sensors. Image sensors include a light-sensing unit for sensing light, and a logic circuit unit for processing the sensed light into an electric signal to store data. A logic circuit unit of a CMOS image sensor using CMOS technology includes MOS transistors disposed on a semiconductor substrate to correspond to unit pixels, and the MOS transistors sequentially detect outputs of the unit pixels in a switching mode.

Image sensors may include a color filter and a photoelectric conversion film. The color filter separates light according to colors, and the photoelectric conversion film converts light into an electric signal. As such, since the color filter and the photoelectric conversion film are separated from each other, processes for manufacturing an image sensor are complex and since light passes through a plurality of layers, light utilization efficiency is reduced.

SUMMARY

Provided are image sensors having simple structures.

Provided are methods of manufacturing image sensors having simple structures.

Additional aspects will be set forth in part in the description which follows and, in part, will be apparent from the description, or may be learned by practice of the presented embodiments.

According to an aspect of the present invention, an image sensor includes: a substrate; first electrodes disposed on the substrate; a photoelectric conversion layer including a plurality of photoelectric conversion units each of which is horizontally arranged on the first electrodes and configured to emit electric signals by absorbing predetermined or reference color beams of a corresponding color; and a second electrode disposed on the photoelectric conversion layer.

Each of the plurality of photoelectric conversion units may include a p/n hetero junction layer, p/i/n hetero junction layer, or p/n bulk hetero junction layer.

The photoelectric conversion layer may include a first photoelectric conversion unit configured to emit an electric signal by absorbing a blue beam, a second photoelectric conversion unit configured to emit an electric signal by absorbing a green beam, and a third photoelectric conversion unit configured to emit an electric signal by absorbing a red beam.

At least one of the photoelectric conversion units may include a p-type material formed of rubrene or a thiophene derivative, and an n-type material formed of fullerene or a fullerene derivative.

At least one of the photoelectric conversion units may include a p-type material formed of a 3,4-ethylenedioxythiophene (EDOT) derivative, and an n-type material formed of Alq3, naphthalence-1,4,5,8-tetracarboxylic dianhydride (NTCDA), or a C60 derivative.

At least one of the photoelectric conversion units may include a p-type material formed of phtalocyanine, and an n-type material formed of NTCDA, Alq3, or a C60 derivative.

The photoelectric conversion layer may include a patternable material.

Each of the photoelectric conversion layer may include a patternable functional group.

The image sensor may further include signal charge readout circuits configured to read out electric signals from the first electrodes.

The image sensor may further include carrier paths connected between the first electrodes and the signal charge readout circuits.

According to another aspect of the present invention, a method of manufacturing an image sensor includes: forming first electrodes on a substrate; coating a patternable first photoelectric conversion material on the first electrodes; patterning a first photoelectric conversion unit and forming a resultant structure by exposing the first photoelectric conversion material using a first mask; coating a patternable second photoelectric conversion material on the resultant structure including the first photoelectric conversion unit; patterning a second photoelectric conversion unit by exposing the second photoelectric conversion material by using a second mask; and stacking a second electrode on the first photoelectric conversion unit and the second photoelectric conversion unit.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
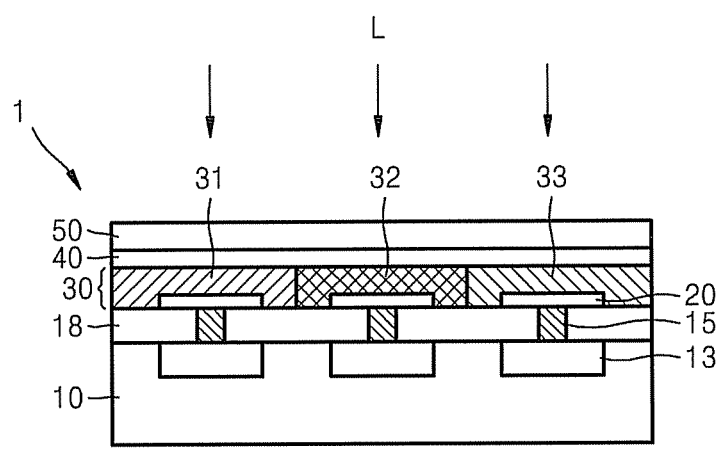
FIG. 1 is a cross-sectional view of an image sensor according to an embodiment of the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a cross-sectional view of an image sensor 1 according to an embodiment of the present invention. The image sensor 1 includes a substrate 10, first electrodes 20, a second electrode 40, and a photoelectric conversion layer 30 that is disposed between the first electrodes 20 and the second electrode 40. The substrate 10 may be a semiconductor substrate. The first electrodes 20 may be anodes (or cathodes), and may be used as pixel electrodes. The plurality of first electrodes 20 may be horizontally arranged in parallel to the substrate 10 to be separated from one another. Each of the first electrodes 20 may be formed of a transparent conductive material such as indium tin oxide (ITO), indium zinc oxide (IZO), zinc oxide (ZnO), or $SnO_2$. The second electrode 40 may be a cathode (or an anode). The second electrode 40 may be used as a common electrode. The second electrode 40 may have a work function that is less than, equal to, or greater than that of the first electrodes 20. The second electrode 40 may be formed of a transparent conductive material such as ITO, IZO, ZnO, or $SnO_2$, or a metal. The metal may be at least one selected from the group consisting of aluminum (Al), copper (Cu), titanium (Ti), gold (Au), platinum (Pt), silver (Ag), and chromium (Cr). However, the present embodiment is not limited thereto. If the second electrode 40 is a metal electrode, the second electrode 40 may be a semitransparent electrode with a thickness equal to or less than 20 nm.

The photoelectric conversion layer 30 may convert light into an electric signal by using a photoelectric conversion effect. Also, the photoelectric conversion layer 30 may be a color selective layer. The photoelectric conversion layer 30 may include a plurality of photoelectric conversion units each of which converts a predetermined or reference color beam into an electric signal. The photoelectric conversion units may be respectively disposed in units of pixels. The plurality of photoelectric conversion units in the photoelectric conversion layer 30 may be horizontally arranged in parallel to the substrate 10. For example, the photoelectric conversion layer 30 may include a plurality of photoelectric conversion units that are horizontally arranged in parallel to the substrate 10 and convert different color beams into electric signals. However, the present embodiment is not limited thereto, and the photoelectric conversion units may be arranged in various ways. The photoelectric conversion layer 30 may include a first photoelectric conversion unit 31 that absorbs a first color beam and generates an electric signal, a second photoelectric conversion unit 32 that absorbs a second color beam and generates an electric signal, and a third photoelectric conversion unit 33 that absorbs a third color beam and generates an electric signal.

Each of the first photoelectric conversion unit 31, the second photoelectric conversion unit 32, and the third photoelectric conversion unit 33 may have a p/n, p/i/n, or p/n bulk hetero junction structure. Each of the first photoelectric conversion unit 31, the second photoelectric conversion unit 32, and the third photoelectric conversion unit 33 may include a p-type material and an n-type material.

The first photoelectric conversion unit 31 may generate an electric signal by absorbing, for example, a blue beam. The first photoelectric conversion unit 31 may include rubrene as a p-type material, and fullerene or a fullerene derivative as an n-type material. Here, the fullerene may be, for example, C60 fullerene. Additional examples of the fullerene derivative which may be used for the n-type material may include C70 fullerene, C76 fullerene, C78 fullerene, and C80 fullerene.

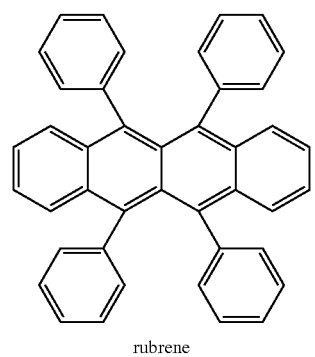

rubrene

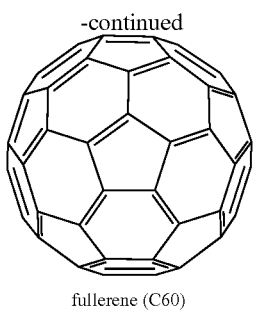

fullerene (C60)

As another example, the first photoelectric conversion unit 31 may include tetracene as a p-type material, and naphthalence-1,4,5,8-tetracarboxylic dianhydride (NTCDA) as an n-type material. Besides the materials mentioned above, a thiophene derivative may be used.

The second photoelectric conversion unit 32 may generate an electric signal by absorbing, for example, a green beam. The second photoelectric conversion unit 33 may include a 3,4-ethylenedioxythiophene (EDOT) derivative as a p-type material. Here, the EDOT derivative may be, for example, hexa-3,4-ethylenedioxythiophene.

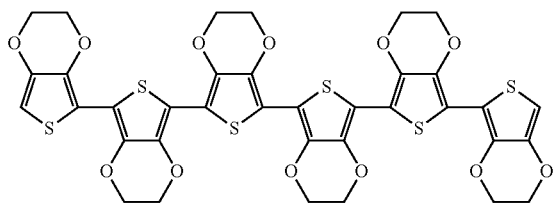 [SMILES: c1sc(-c2sc(-c3sc(-c4sc(-c5sc(-c6scc7c6OCCO7)c6c5OCCO6)c5c4OCCO5)c4c3OCCO4)c3c2OCCO3)c2c1OCCO2]

hexa-3,4-ethylenedioxythiophene

The EDOT derivative, e.g., hexa-3,4-ethylenedioxythiophene, may absorb a green beam. The second photoelectric conversion unit 33 may include Alq3 or NTCDA as an n-type material. Besides, a cyanine-based pigment or a squarylium-based pigment may be used as a p-type material. Also, Alq3 or C60 may be used as an n-type material.

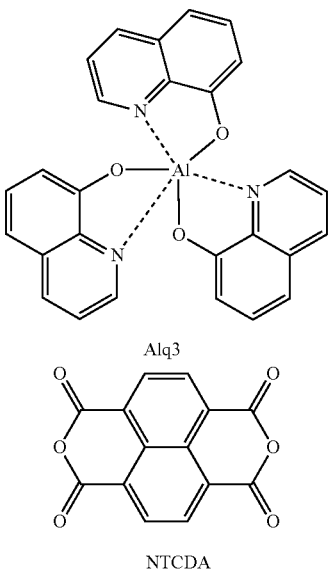

Alq3

NTCDA

The third photoelectric conversion unit 33 may generate an electric signal by absorbing, for example, a red beam. The third photoelectric conversion unit 33 may include NTCDA, Alq3, or C60 as an n-type material. And, the third photoelectric conversion unit 33 may include phtalocyanine as a p-type material.

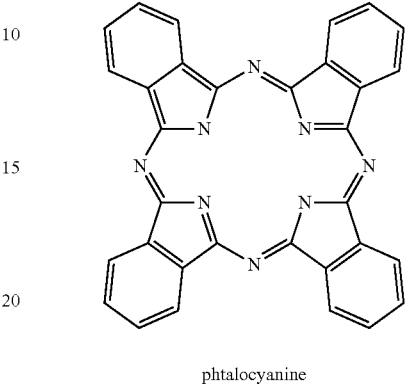

phtalocyanine

Although one first photoelectric conversion unit 31, one second photoelectric conversion unit 32, and one third photoelectric conversion unit 33 are arranged in FIG. 1, the present embodiment is not limited thereto, and one first photoelectric conversion unit 31, two second photoelectric conversion units 32, and one third photoelectric conversion unit 33 may be arranged. Also, the first through third photoelectric conversion units 31, 32, and 33, which are horizontally arranged in parallel to the substrate 10, may not be aligned but may be arranged in a 2×2 configuration.

Each of the first through third photoelectric conversion units 31, 32, and 33 may be formed of an organic photoelectric conversion material. And, each of the first through third photoelectric conversion units 31, 32, and 33 may be formed of a photoelectric conversion material including a patternable material. Examples of the patternable material may include, for example, an epoxy group and an acryl group. Alternatively, each of the first through third photoelectric conversion units 31, 32, and 33 may be formed of a photoelectric conversion material including a patternable functional group. Alternatively, a photoelectric conversion material may be included as a component in patternable materials.

Meanwhile, a plurality of signal charge readout circuits 13 may be disposed in the substrate 10. The plurality of signal charge readout circuits 13 may be arranged to be separated from one another. The signal charge readout circuits 13 may be disposed to correspond to pixels of the image sensor 1. Carrier paths 15 may be connected between the signal charge readout circuits 13 and the first electrodes 20. A first insulating layer 18 may be disposed between the substrate 10 and the photoelectric conversion layer 30. Also, a protective film 50 may be further disposed on the second electrode 40. Alternatively, a micro lens may be further disposed in order to improve light utilization efficiency.

An operation of the image sensor 1 will be explained below. When light L is incident on the image sensor 1, each of beams may be selected for every pixel by the photoelectric conversion layer 30 to be converted into an electric signal. For example, the first photoelectric conversion unit 31 may absorb the energy of a blue beam of the light L incident on the image sensor 1 to generate electrons and holes, and, for example, the electrons may be moved to the first electrodes 20 and the holes may be moved to the second electrode 40, thereby enabling current to flow and generating an electric signal. Alternatively, according to a type of the photoelectric conversion layer 30, electrons may be moved to the second electrode 40 and holes may be moved to the first electrodes 20, thereby enabling current to flow. The second photoelectric conversion unit 32 may absorb the energy of a green beam of the light L incident on the image sensor 1 to generate electrons and holes, thereby generating an electric signal. The third photoelectric conversion unit 33 may absorb the energy of a red beam of the light L incident on the image sensor L to generate electrons and holes, thereby generating an electric signal. The electrons generated in the first through third photoelectric conversion units 31, 32, and 33 may be respectively moved to the signal charge readout circuits 13 through the carrier paths 15, and may be processed as image signals by the signal charge readout circuits 13.

Since the image sensor 1 includes the photoelectric conversion layer 30 that is able to select a color, an additional color filter is not necessary. Accordingly, the number of components may be reduced and thus manufacturing costs may be reduced. Also, since the photoelectric conversion layer 30, which is able to select a color, is horizontally arranged, a structure of the photoelectric conversion layer 30 is simple. Also, since the structure of the photoelectric conversion layer 30 is simple, a decrease in light utilization efficiency which may occur when light passes through a plurality of layers may be avoided.

Figure 2:
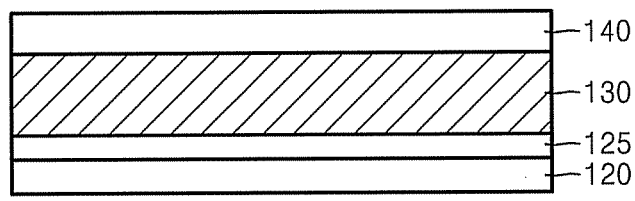
FIG. 2 is a partial cross-sectional view of an image sensor according to another embodiment of the present invention.

FIG. 2 is a partial cross-sectional view of an image sensor in one pixel, according to another embodiment of the present invention. When compared with the image sensor of FIG. 1, there is a difference in a structure between a first electrode 120 and a second electrode 140. A photoelectric conversion layer 130 may be disposed between the first electrode 120 and the second electrode 140, and a first buffer layer 125 may be further disposed between the first electrode 120 and the photoelectric conversion layer 130.

Figure 3:
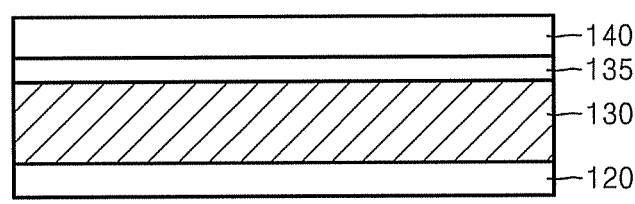
FIG. 3 is a partial cross-sectional view of an image sensor according to another embodiment of the present invention.

FIG. 3 is a partial cross-sectional view of an image sensor according to another embodiment of the present invention. Referring to FIG. 3, a second buffer layer 135 is further disposed between the photoelectric conversion layer 130 and the second electrode 140. Alternatively, the first buffer layer 125 may be disposed between the first electrode 120 and the photoelectric conversion layer 130, and the second buffer layer may be disposed between the photoelectric conversion layer 130 and the second electrode 140.

The first and second buffer layers 125 and 135 may be used as electron transport layers in order to more easily carry electrons. Alternatively, the first and second buffer layers 125 and 135 may be used as hole blocking layers. The hole blocking layers may act as protective films for preventing the migration of holes and preventing electrical short-circuit. Alternatively, the first and second buffer layers 125 and 135 may function as both electron transport layers and hole blocking layers. The first buffer layer 125 may include, for example, poly(3,4-ethylenedioxythiophene) (PEDOT) or poly(styrene sulfonate) (PSS). The second buffer layer 135 may bathocuproine (BCP) or LiF.

FIGS. 4A through 4L are cross-sectional views illustrating a method of manufacturing an image sensor, according to an embodiment of the present invention.

Figure 4A:
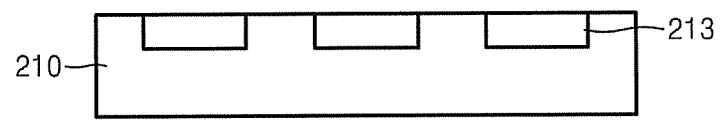
FIGS. 4A through 4L illustrate a method of manufacturing an image sensor, according to an embodiment of the present invention.
Figure 4B:
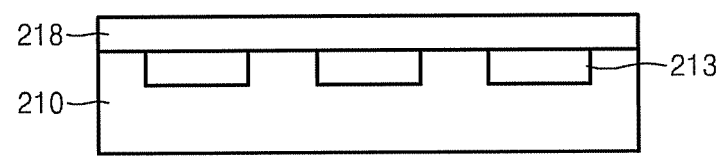
Figure 4C:
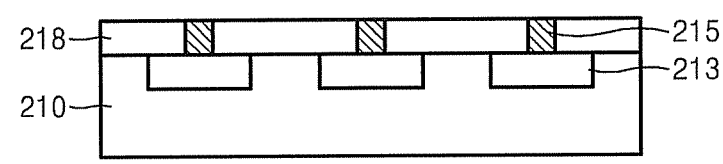

Referring to FIG. 4A, a plurality of signal charge readout circuits 213 may be formed by using a semiconductor process in a substrate 210. The signal charger readout circuits 213 may be formed to have the same top surfaces as a top surface of the substrate 210. The signal charge readout circuits 213 may be horizontally arranged in parallel to the substrate 210 to be separated from one another. Referring to FIG. 4B, a first insulating layer 218 is stacked on the signal charge readout circuits 213. Referring to FIG. 4C, via-holes may be formed by using wet etching or dry etching in the first insulating layer 218, and the via-holes may be metalized to form carrier paths 215.

Figure 4D:
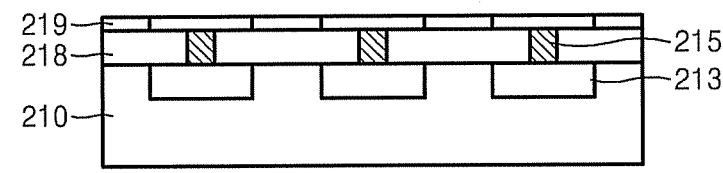
Figure 4E:
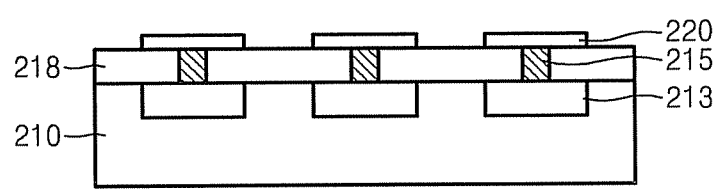
Figure 4F:
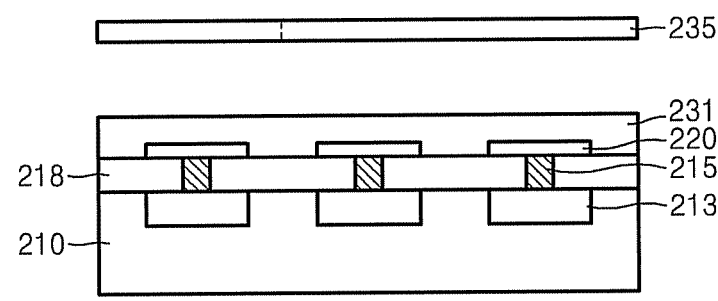
Figure 5:
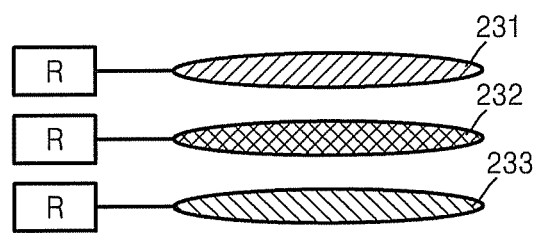
FIG. 5 illustrates an example where a functional group is combined with a photoelectric conversion material used in the method of FIGS. 4A through 4L.

Referring to FIG. 4D, a first electrode layer 219 may be coated on a resultant structure illustrated in FIG. 4C, and referring to FIG. 4E, a plurality of first electrodes 220 may be formed by using, for example, photolithography. Next, referring to FIG. 4F, a first photoelectric conversion layer 231 may be coated on the first electrodes 220. The first photoelectric conversion layer 231 may include a material which contains a patternable material and undergoes photoelectric conversion with respect to a first color beam. The first photoelectric conversion layer 231 may include a material that contains a patternable functional group and undergoes photoelectric conversion with respect to a first color beam. The material that undergoes photoelectric conversion with respect to the first color beam, for example, a blue beam, may include rubrene as a p-type material, and may include fullerene or a fullerene derivative as an n-type material. FIG. 5 illustrates a structure in which a patternable functional group R (the functional group may be oxirane, oxetane, vinyl, trifluorovinyl ether, styrene, acrylic, benzocyclobutane, etc) is combined with a photoelectric conversion material. The patternable functional group may be inherently included in the photoelectric conversion material or may be included as a part of components.

The first photoelectric conversion layer 213 may be coated by using, for example, spin coating. Since the first photoelectric conversion layer 213 is patternable, the first photoelectric conversion layer 213 may be patterned by being exposed by using a first mask 235. A first photoelectric conversion unit 231a may be formed by removing a portion of the first photoelectric conversion layer 231 according to a pattern of the first photoelectric conversion layer 231. The first mask 235 may expose an area where the first photoelectric conversion unit 231a is to be formed, or an area other than the area where the first photoelectric conversion unit 231a is to be formed.

Figure 4G:
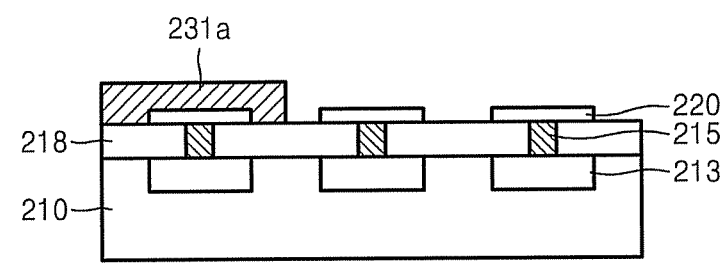
Figure 4H:
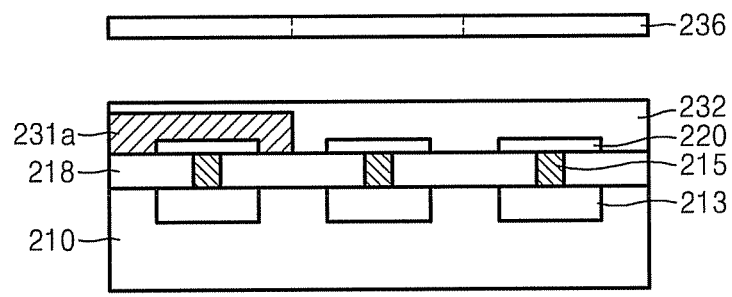
Figure 4I:
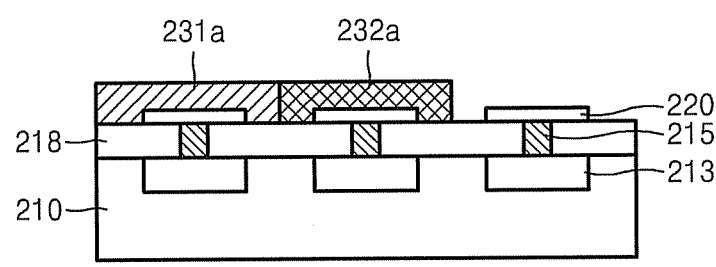

Next, referring to FIG. 4H, a second photoelectric conversion layer 232 may be coated on a resultant structure illustrated in FIG. 4G by using, for example, spin coating. The second photoelectric conversion layer 232 may include a material that contains a patternable material and undergoes photoelectric conversion with respect to a second color beam. Alternatively, the second photoelectric conversion layer 232 may include a material that contains a patternable functional group and undergoes photoelectric conversion with respect to a second color beam. The material which undergoes photoelectric conversion with respect to the second color beam, for example, a green beam, may include EDOT as a p-type material, and Alq3 or NTCDA as an n-type material. And, the second photoelectric conversion layer 232 may be patterned by using a second mask 236. Referring to FIG. 4I, a second photoelectric conversion unit 232a may be formed by removing a portion of the second photoelectric conversion layer 232 according to a pattern of the second photoelectric conversion layer 232.

Figure 4J:
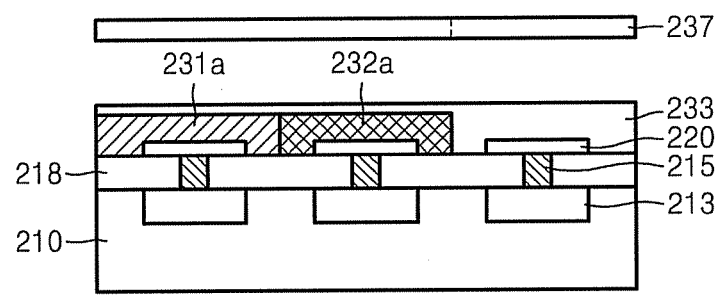
Figure 4K:
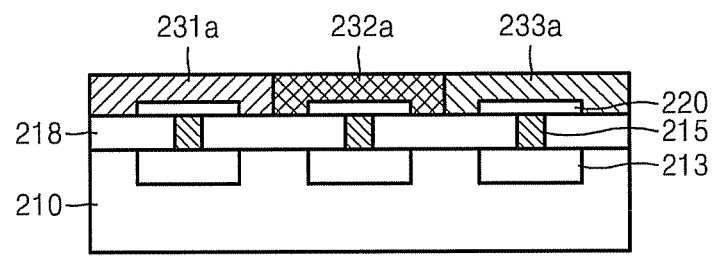

Next, referring to FIG. 4J, a third photoelectric conversion layer 233 may be coated on a resultant structure illustrated in FIG. 4I by using, for example, spin coating. The third photoelectric conversion layer 233 may include a material that contains a patternable material and undergoes photoelectric conversion with respect to a third color beam. Alternatively, the third photoelectric conversion layer 233 may include a material that contains a patternable functional group and undergoes photoelectric conversion with respect to a third color beam. The material that undergoes photoelectric conversion with respect to the third color beam, for example, a red beam, may include NTCDA as an n-type material, and phtalocyanine as a p-type material. And, the third photoelectric conversion layer 233 may be patterned by being exposed by using a third mask 237. Referring to FIG. 4K, a third photoelectric conversion unit 233a may be formed by removing a portion of the third photoelectric conversion layer 233 according to a pattern of the third photoelectric conversion layer 233.

Figure 4L:
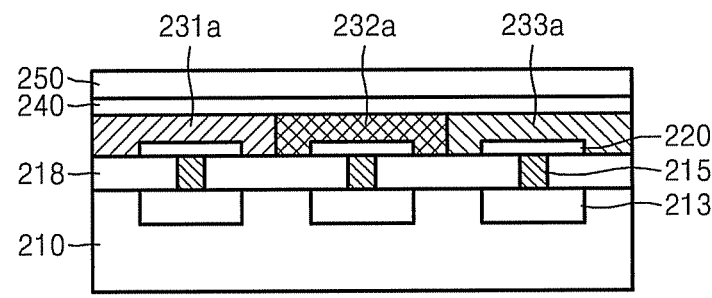

Next, referring to FIG. 4L, a second electrode 240 and a protective film 250 may be stacked on the first through third photoelectric conversion units 231a, 232a, and 233a. Alternatively, a micro lens may be further disposed on the second electrode 240.

As described above, according to the one or more embodiments of the present invention, the method of manufacturing the image sensor may pattern a photoelectric conversion layer that undergoes photoelectric conversion with respect to a predetermined or reference color beam. Since the photoelectric conversion layer is formed by using patterning, a manufacturing process may be simplified, and photoelectric conversion units of the photoelectric conversion layer may be horizontally arranged in parallel to a substrate. Since the photoelectric conversion layer is a color selective layer, an additional color filter is not necessary, thereby making it possible to omit a process of manufacturing a color filter. It should be understood, however, that there is no intent to limit exemplary embodiments to the particular forms disclosed, but on the contrary, exemplary embodiments are to cover all modifications, equivalents, and alternatives falling within the scope of the invention. Therefore, the scope of the invention is defined not by the detailed description of the invention but by the appended claims, and all differences within the scope will be construed as being included in the present invention.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor comprising:
a substrate;
first electrodes disposed on the substrate;
a photoelectric conversion layer including a plurality of photoelectric conversion units, each of the plurality of photoelectric conversion units being arranged on a different one of the first electrodes, the plurality of photoelectric conversion units including at least a first photo electric conversion unit and a second photo electric conversion unit, the first photo electric conversion unit including a first material configured to emit electric signals by selectively absorbing light of a first color without a color filter, the second photo electric conversion unit including a second material configured to emit electric signals by selectively absorbing light of a second color without a color filter, the first and second colors being different colors; and
a second electrode disposed on the photoelectric conversion layer, wherein the plurality of photoelectric conversion units surround side surfaces of each of the first electrodes such that each of the first electrodes are separated from each other,
the second electrode including at least one continuously planar portion that completely overlaps at least two of the plurality of photoelectric conversion units.

2. The image sensor of claim 1, wherein each of the plurality of photoelectric conversion units includes a p/n, p/i/n, or p/n bulk hetero junction layer.

3. The image sensor of claim 1, wherein,
the first photoelectric conversion unit is configured to emit an electric signal by absorbing a blue beam,
the second photoelectric conversion unit is configured to emit an electric signal by absorbing a green beam, and
the photoelectric conversion layer further includes a third photoelectric conversion unit configured to emit an electric signal by absorbing a red beam.

4. The image sensor of claim 1, wherein at least one of the photoelectric conversion units includes
a p-type material formed of rubrene or a thiophene derivative, and
an n-type material formed of fullerene or a fullerene derivative.

5. The image sensor of claim 1, wherein at least one of the photoelectric conversion units includes
a p-type material formed of a 3,4-ethylenedioxythiophene (EDOT) derivative, and
an n-type material formed of Alq3, naphthalence-1,4,5,8-tetracarboxylic dianhydride (NTCDA), or a C60 derivative.

6. The image sensor of claim 1, wherein at least one of the photoelectric conversion units includes
a p-type material formed of phtalocyanine, and
an n-type material formed of NTCDA, Alq3, or a C60 derivative.

7. The image sensor of claim 1, wherein the photoelectric conversion layer includes a patternable material.

8. The image sensor of claim 1, wherein the photoelectric conversion layer includes a patternable functional group.

9. The image sensor of claim 1, further comprising:
signal charge readout circuits configured to read out electric signals from the first electrodes.

10. The image sensor of claim 9, further comprising:
carrier paths connected between the first electrodes and the signal charge readout circuits.

11. The image sensor of claim 1, wherein the first electrodes are pixel electrodes and the second electrode is common electrode.

12. The image sensor of claim 1, wherein the plurality of photoelectric conversion units are arranged to contact each other such that the first material is adjacent to the second material.

* * * * *